US012635314B2

(12) United States Patent
Zhang et al.

(10) Patent No.: US 12,635,314 B2
(45) Date of Patent: May 19, 2026

(54) LIGHT-EMITTING MODULE EMITTING COLOR LIGHT AND METHOD FOR MANUFACTURING THE SAME, DISPLAY PANEL, AND ELECTRONIC DEVICE

(71) Applicant: Nothing Technology Limited, London (GB)

(72) Inventors: Geoffrey Zhang, Shenzhen (CN); Terry Huang, Shenzhen (CN)

(73) Assignee: Nothing Technology Limited, London (GB)

( * ) Notice: Subject to any disclaimer, the term of this patent is extended or adjusted under 35 U.S.C. 154(b) by 355 days.

(21) Appl. No.: 18/345,896

(22) Filed: Jun. 30, 2023

(65) Prior Publication Data

US 2024/0006565 A1 Jan. 4, 2024

(30) Foreign Application Priority Data

Jul. 4, 2022 (CN) .......................... 202210781104.5

(51) Int. Cl.
*H01L 33/48* (2010.01)
*H01L 25/075* (2006.01)
(Continued)

(52) U.S. Cl.
CPC ..... *H10H 20/8506* (2025.01); *H01L 25/0753* (2013.01); *H10H 20/8514* (2025.01); *H10H 20/0361* (2025.01)

(58) Field of Classification Search
CPC .......... G09F 9/301; F21K 9/64; H10K 59/221
See application file for complete search history.

(56) References Cited

U.S. PATENT DOCUMENTS 8,907,364 B2 12/2014 Bierhuizen
2018/0182940 A1 6/2018 Yamamoto et al.
(Continued)

FOREIGN PATENT DOCUMENTS

CN 105114842 A 12/2015
KR 20170036474 A 4/2017
TW I762172 B * 4/2022

OTHER PUBLICATIONS

European search report from Application No. 23183055.5 dated Nov. 8, 2023.

*Primary Examiner* — Tracie Y Green
(74) *Attorney, Agent, or Firm* — Calfee, Halter & Griswold LLP

(57) ABSTRACT

A light-emitting module includes a carrier circuit board, a light-blocking wall, a light conversion medium layer, and multiple light-emitting chips. The multiple light-emitting chips are packaged on the carrier circuit board, and each light-emitting chip is configured to emit first color light. The light-blocking wall is on the carrier circuit board and surrounds the multiple light-emitting chips. The light conversion medium layer covers the multiple light-emitting chips and part of the carrier circuit board in a space enclosed by the light-blocking wall. The light conversion medium layer is configured to convert the first color light emitted by the light-emitting chips into second color light. One side of the light conversion medium layer away from the carrier circuit board exceeds one side of the light-blocking wall away from the carrier circuit board, and an edge of the light conversion medium layer exceeding the light-blocking wall covers a surface of the light-blocking wall away from the carrier circuit board.

16 Claims, 5 Drawing Sheets

(51) Int. Cl.
    *H01L 33/50*         (2010.01)
    *H10H 20/85*        (2025.01)
    *H10H 20/851*      (2025.01)
    *H10H 20/01*        (2025.01)

(56)              References Cited

U.S. PATENT DOCUMENTS

| | | | |
|---|---|---|---|
| 2022/0310872 A1* | 9/2022 | Xu | H10H 20/8506 |
| 2022/0416196 A1* | 12/2022 | Lee | H10K 59/80518 |
| 2024/0177635 A1* | 5/2024 | Herrmann | G09F 19/12 |

* cited by examiner

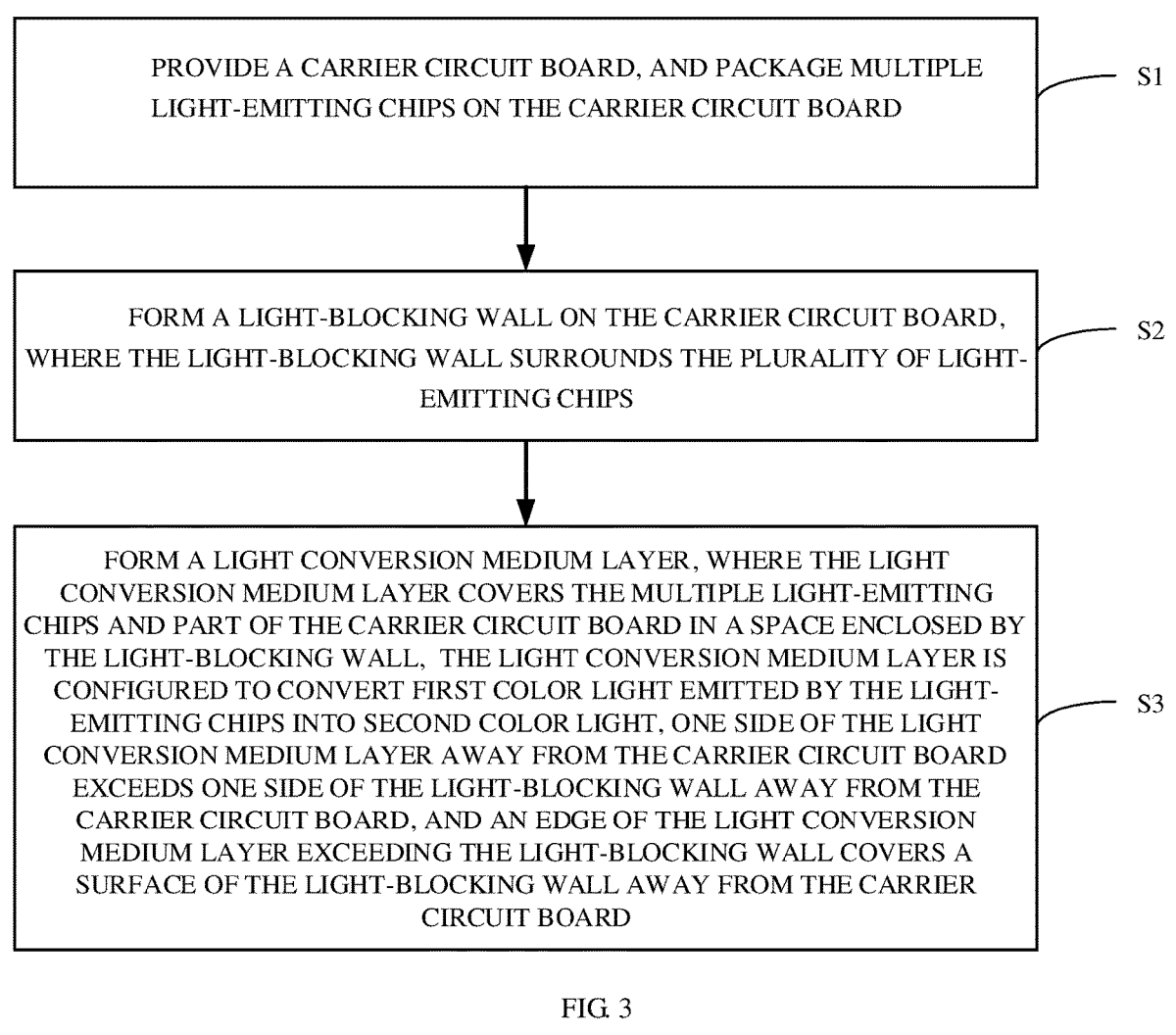

PROVIDE A CARRIER CIRCUIT BOARD, AND PACKAGE MULTIPLE LIGHT-EMITTING CHIPS ON THE CARRIER CIRCUIT BOARD — S1

FORM A LIGHT-BLOCKING WALL ON THE CARRIER CIRCUIT BOARD, WHERE THE LIGHT-BLOCKING WALL SURROUNDS THE PLURALITY OF LIGHT-EMITTING CHIPS — S2

FORM A LIGHT CONVERSION MEDIUM LAYER, WHERE THE LIGHT CONVERSION MEDIUM LAYER COVERS THE MULTIPLE LIGHT-EMITTING CHIPS AND PART OF THE CARRIER CIRCUIT BOARD IN A SPACE ENCLOSED BY THE LIGHT-BLOCKING WALL, THE LIGHT CONVERSION MEDIUM LAYER IS CONFIGURED TO CONVERT FIRST COLOR LIGHT EMITTED BY THE LIGHT-EMITTING CHIPS INTO SECOND COLOR LIGHT, ONE SIDE OF THE LIGHT CONVERSION MEDIUM LAYER AWAY FROM THE CARRIER CIRCUIT BOARD EXCEEDS ONE SIDE OF THE LIGHT-BLOCKING WALL AWAY FROM THE CARRIER CIRCUIT BOARD, AND AN EDGE OF THE LIGHT CONVERSION MEDIUM LAYER EXCEEDING THE LIGHT-BLOCKING WALL COVERS A SURFACE OF THE LIGHT-BLOCKING WALL AWAY FROM THE CARRIER CIRCUIT BOARD — S3

FIG. 3

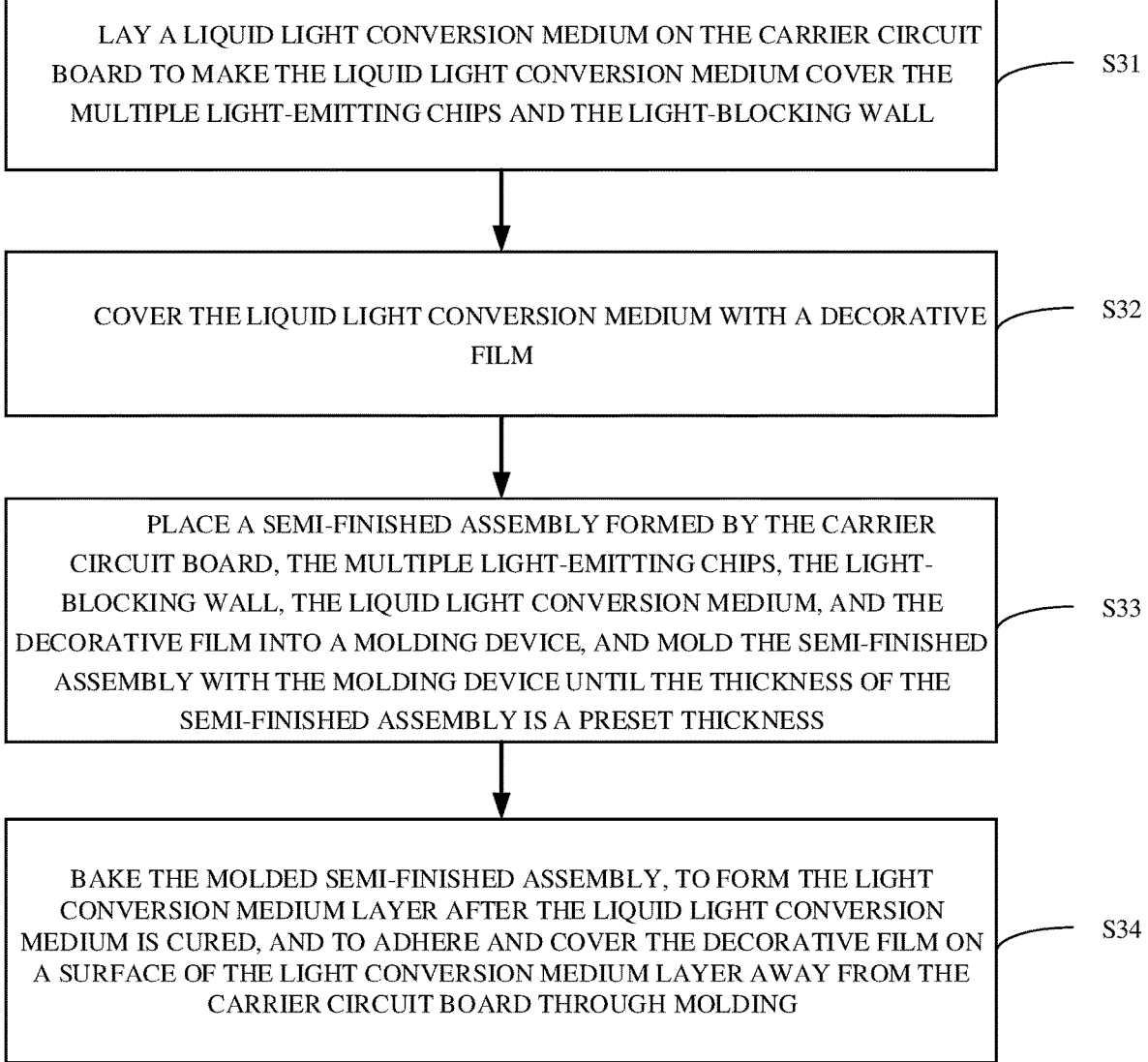

LAY A LIQUID LIGHT CONVERSION MEDIUM ON THE CARRIER CIRCUIT BOARD TO MAKE THE LIQUID LIGHT CONVERSION MEDIUM COVER THE MULTIPLE LIGHT-EMITTING CHIPS AND THE LIGHT-BLOCKING WALL — S31

COVER THE LIQUID LIGHT CONVERSION MEDIUM WITH A DECORATIVE FILM — S32

PLACE A SEMI-FINISHED ASSEMBLY FORMED BY THE CARRIER CIRCUIT BOARD, THE MULTIPLE LIGHT-EMITTING CHIPS, THE LIGHT-BLOCKING WALL, THE LIQUID LIGHT CONVERSION MEDIUM, AND THE DECORATIVE FILM INTO A MOLDING DEVICE, AND MOLD THE SEMI-FINISHED ASSEMBLY WITH THE MOLDING DEVICE UNTIL THE THICKNESS OF THE SEMI-FINISHED ASSEMBLY IS A PRESET THICKNESS — S33

BAKE THE MOLDED SEMI-FINISHED ASSEMBLY, TO FORM THE LIGHT CONVERSION MEDIUM LAYER AFTER THE LIQUID LIGHT CONVERSION MEDIUM IS CURED, AND TO ADHERE AND COVER THE DECORATIVE FILM ON A SURFACE OF THE LIGHT CONVERSION MEDIUM LAYER AWAY FROM THE CARRIER CIRCUIT BOARD THROUGH MOLDING — S34

LIGHT-EMITTING MODULE EMITTING COLOR LIGHT AND METHOD FOR MANUFACTURING THE SAME, DISPLAY PANEL, AND ELECTRONIC DEVICE

CROSS-REFERENCE TO RELATED APPLICATION

The present disclosure claims priority to Chinese Patent Application 202210781104.5, filed on Jul. 4, 2022 and entitled "LIGHT-EMITTING MODULE AND METHOD FOR MANUFACTURING THE SAME, DISPLAY PANEL, AND ELECTRONIC DEVICE", which is incorporated herein by reference in its entirety.

TECHNICAL FIELD

This disclosure relates to the field of display technology, and in particular, to a light-emitting module and a method for manufacturing the same, a display panel, and an electronic device.

BACKGROUND

Currently, most display screens of electronic devices such as mobile phones and tablet computers use a light-emitting diode (LED) light strip as a backlight source, and an existing LED light strip is generally composed of a circuit board, LED chips, fluorescent adhesive, and dam adhesive. The LED chips are packaged on the circuit board, the fluorescent adhesive covers the LED chips, and the dam adhesive surrounds an outer side of the fluorescent adhesive to prevent the fluorescent adhesive from flowing out. However, due to the opaque performance of the adhesive dam, when the LED light strip is at the back side of the display screen as a backlight source, brightness of part of the display screen corresponding to the adhesive dam is less than the brightness of the rest part of the display screen, and in severe cases, a black border may also occur, which affects the display effect of the display screen and brings bad experience to a user.

SUMMARY

The present disclosure aims to solve at least one of the technical problems existing in the related art. To this end, a light-emitting module and a method for manufacturing the same, a display panel, and an electronic device are provided in the present disclosure. When the light-emitting module is used as a backlight source of the display panel, a black border can be avoided, thereby improving the display effect of the display panel and bringing good visual experience to a user.

In order to achieve the above purpose, a light-emitting module is provided in the first aspect. The light-emitting module includes a carrier circuit board, multiple light-emitting chips, a light-blocking wall, and a light conversion medium layer. The multiple light-emitting chips are packaged on the carrier circuit board, where each of the multiple light-emitting chips is configured to emit first color light. The light-blocking wall is on the carrier circuit board and surrounds the multiple light-emitting chips. The light conversion medium layer covers the multiple light-emitting chips and part of the carrier circuit board in a space enclosed by the light-blocking wall, the light conversion medium layer is configured to convert the first color light emitted by the light-emitting chips into second color light, one side of the light conversion medium layer away from the carrier circuit board exceeds one side of the light-blocking wall away from the carrier circuit board, and an edge of the light conversion medium layer exceeding the light-blocking wall covers a surface of the light-blocking wall away from the carrier circuit board.

In an embodiment, the light-emitting module further includes a decorative film covering the light conversion medium layer. The decorative film includes a film body and a decorative layer on the film body, the decorative layer includes at least one of a semitransparent colored ink layer, a texture layer, or a light diffusing ink layer, and the texture layer is transparent or semitransparent. The semitransparent colored ink layer is configured to make the decorative film present a same color as the semitransparent colored ink layer when the light-emitting chips emit no light, the texture layer is configured to make the decorative film present at least one appearance effect of a pattern effect, a dazzle effect, a matt effect, or a discoloration effect when the light-emitting chips emit no light, and the light diffusing ink layer is configured to evenly disperse light passing through the light diffusing ink layer when the light-emitting chips emit light.

In an embodiment, the decorative layer includes a first texture layer and a second texture layer, the second texture layer includes multiple micro-structures on a surface of the film body away from the light conversion medium layer and a brightness enhancement film covering the multiple micro-structures, each of the microstructures has at least one reflective surface, and an angle between a reflective surface and the film body is greater than 90°, and the second texture layer is configured to present the dazzle effect. The first texture layer is on a surface of the brightness enhancement film away from the film body, the first texture layer has at least one stripe texture of a linear texture, a coil texture, or a wave texture, and the first texture layer is configured to present the pattern effect.

In an embodiment, the decorative layer further includes the semitransparent colored ink layer on a surface of the film body close to the light conversion medium layer and the light diffusing ink layer on a surface of the semitransparent colored ink layer close to the light conversion medium layer.

In an embodiment, the light-blocking wall has a same color as the second color light at least on an outer surface of the light-blocking wall away from the light-emitting chips.

In an embodiment, the carrier circuit board is a flexible circuit board (FCB) or a printed circuit board (PCB), and/or the multiple light-emitting chips include at least one of a light-emitting diode (LED), a mini LED, and a micro LED, and/or the light-blocking wall is a dam adhesive dispensed on the carrier circuit board, and/or the light conversion medium layer is a fluorescent adhesive layer or a quantum-dot (QD) adhesive layer.

In a second aspect, a method for manufacturing a light-emitting module is provided, the method for manufacturing a light-emitting module includes: providing a carrier circuit board, and packaging multiple light-emitting chips on the carrier circuit board; forming a light-blocking wall on the carrier circuit board, where the light-blocking wall surrounds the multiple light-emitting chips; and forming a light conversion medium layer, where the light conversion medium layer covers the multiple light-emitting chips and part of the carrier circuit board in a space enclosed by the light-blocking wall, the light conversion medium layer is configured to convert first color light emitted by the light-emitting chips into second color light, one side of the light conversion medium layer away from the carrier circuit board exceeds one side of the light-blocking wall away from the carrier circuit board, and an edge of the light conversion medium layer exceeding the light-blocking wall covers a surface of the light-blocking wall away from the carrier circuit board.

In an embodiment, forming the light conversion medium layer includes: laying a liquid light conversion medium on the carrier circuit board to make the liquid light conversion medium cover the multiple light-emitting chips and the light-blocking wall; covering the liquid light conversion medium with a decorative film; placing a semi-finished assembly formed by the carrier circuit board, the multiple light-emitting chips, the light-blocking wall, the liquid light conversion medium, and the decorative film into a molding device, and molding the semi-finished assembly with the molding device until the semi-finished assembly has a preset thickness; and baking the molded semi-finished assembly, to form the light conversion medium layer after the liquid light conversion medium is cured, and to adhere and cover the decorative film on a surface of the light conversion medium layer away from the carrier circuit board by molding.

In an embodiment, the method further includes the following after the formed light conversion medium layer is in a solid state and the light conversion medium layer is formed. A decorative film is covered on the light conversion medium layer in the solid state, where the decorative film is adhesively fixed to a surface of the light conversion medium layer away from the carrier circuit board.

In an embodiment, the decorative film includes a film body and a decorative layer on the film body, the decorative layer includes at least one of a semitransparent colored ink layer, a texture layer, or a light diffusing ink layer, and the texture layer is transparent or semitransparent. The semi-transparent colored ink layer is configured to make the decorative film present a same color as the semitransparent colored ink layer when the light-emitting chips emit no light, the texture layer is configured to make the decorative film present at least one appearance effect of a pattern effect, a dazzle effect, a matt effect, or a discoloration effect when the light-emitting chips emit no light, and the light diffusing ink layer is configured to evenly disperse light passing through the light diffusing ink layer when the light-emitting chips emit light.

In an embodiment, the method further includes: cutting down from a surface of the decorative film away from the carrier circuit board along an edge of the light-blocking wall until the carrier circuit board is cut off, to obtain a light-emitting module with a preset shape, where a cutting surface generated in cutting is located between an outer side of the light-blocking wall and an inner side of the light-blocking wall.

In a third aspect, a display panel is provided. The display panel includes a display screen and the light-emitting module in any of the above embodiments. The light-emitting module is at a non-display side of the display screen.

In a fourth aspect, an electronic device is provided. The electronic device includes a housing and a display panel on the housing. The display panel includes a display screen and the light-emitting module in any of the above embodiments, and the light-emitting module is at a non-display side of the display screen.

In an embodiment, the housing has a transparent region, the light-emitting module is at an inner side of the housing, and the light-emitting module is visible on the housing through the transparent region.

Compared with the related art, the present disclosure has following beneficial effects. In the light-emitting module provided in the present disclosure, The light conversion medium layer covers both the multiple light-emitting chips and the light-blocking wall, due to a light-transmission property of the light conversion medium layer, when the multiple light-emitting chips emit light, both part of the light conversion medium layer covering the light-blocking wall and part of the light conversion medium layer in the space enclosed by the light-blocking wall emit light and have substantially the same brightness. Thus, the brightness of a whole surface of the light-emitting module is evenly, when the light-emitting module emits light, and the brightness of part of the light-emitting module corresponding to the light-blocking wall will not be less than the brightness of the rest part of the light-emitting module, as such a black border is avoided. When the light-emitting module is used as a backlight source of the display panel, the display effect of the display panel can be improved, and good visual experience can be brought to a user.

Additional aspects and advantages of the present disclosure will be given in part in the following descriptions, become apparent in part from the following descriptions, or be learned from the practice of the present disclosure.

BRIEF DESCRIPTION OF THE DRAWINGS

To describe technical solutions in embodiments of the present disclosure more clearly, the following will briefly introduce accompanying drawings required for describing embodiments. Apparently, the accompanying drawings described below are merely some embodiments of the present disclosure, and persons of ordinary skill in the art may still obtain other drawings from these accompanying drawings without creative efforts.

FIG. 3 is a schematic flowchart of a method for manufacturing a light-emitting module provided in an embodiment of the present disclosure.

FIG. 4 is a schematic sub-flowchart of step S3 in FIG. 3.

FIG. 7 is a three-dimensional schematic structural view of an electronic device in FIG. 5 from another perspective.

Figure 1:
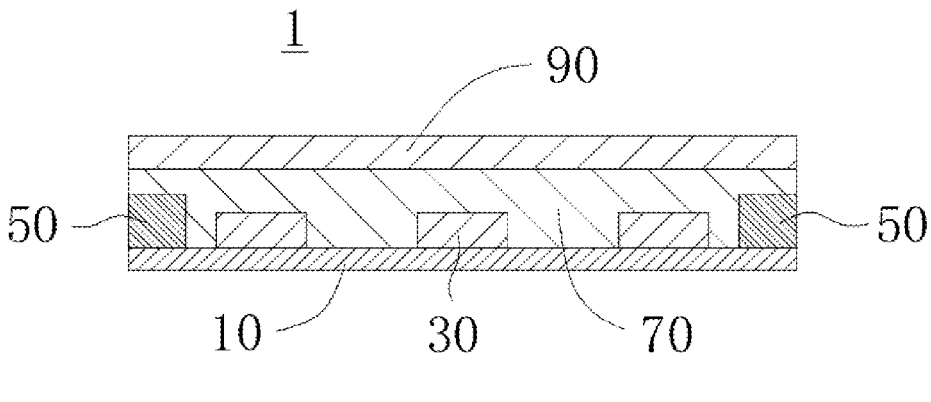
FIG. 1 is a cross-sectional schematic structural view of a light-emitting module provided in an embodiment of the present disclosure.

Reference signs of main components:
light-emitting module 1; carrier circuit board 10; light-emitting chip 30; light-blocking wall 50; light conversion medium layer 70; decorative film 90; film body 91; semitransparent colored ink layer 93; light diffusing ink layer 95; first texture layer 97; second texture layer 99; microstructure 992; brightness enhancement film 994; display panel 100; display screen 3; wireless charging module 5; camera module 7; housing 300; transparent region 310; and electronic device 1000.

The present disclosure will be described with reference to following embodiments in conjunction with the accompanying drawings.

DETAILED DESCRIPTION

Embodiments of the present disclosure will be described below in detail. The embodiments are illustrated in accompanying drawings, where same or similar reference numerals are used to indicate same or similar components or components having same or similar functions. The embodiments described herein with reference to accompanying drawings are exemplary, and merely intended for illustration rather than limitation on the present disclosure.

Please refer to FIG. 1, a light-emitting module 1 is provided in the present disclosure, which includes a carrier circuit board 10, multiple light-emitting chips 30, a light-blocking wall 50, and a light conversion medium layer 70. The multiple light-emitting chips 30 are packaged on the carrier circuit board 10, and each of the multiple light-emitting chips 30 is configured to emit first color light with the driving of the carrier circuit board 10. The light-blocking wall 50 is on the carrier circuit board 10 and surrounds the multiple light-emitting chip 30. The light conversion medium layer 70 covers the multiple light-emitting chips 30 and part of the carrier circuit board 10 in a space enclosed by the light-blocking wall 50. The light conversion medium layer 70 is configured to convert the first color light emitted by the light-emitting chips 30 into second color light.

It should be noted that, the carrier circuit board 10 may be a flexible circuit board (FCB), and may also be a printed circuit board (PCB), and in some embodiments, the carrier circuit board 10 is the FCB. The light-emitting module 1 made by using the FCB as a carrier can be bent and folded according to requirements, and can be applicable to various occasions, thereby enhancing the applicability of the light-emitting module 1.

The multiple light-emitting chips 30 each at least include one of an LED, a mini LED and a micro LED, and in some embodiments, the multiple light-emitting chips 30 each is a mini LED. The multiple light-emitting chips 30 use the same kind of light-emitting chips, which can reduce the design difficulty of a drive circuit of the carrier circuit board 10. In addition, the size of the Mini LED is smaller than the size of the LED and the size of the micro LED, which can reduce the thickness of the light-emitting module 1 (namely, the size in a direction perpendicular to the carrier circuit board 10), thereby being beneficial to reduce the thickness of an electronic device using the light-emitting module 1. The light-emitting module 1 may be provided with one or more light-emitting chips 30. Generally, multiple light-emitting chips 30 may be arranged in a matrix, so as to ensure the uniformity of light emitting of the light-emitting module 1.

In some embodiments of the present disclosure, the light-blocking wall 50 has a same color as the second color light at least on an outer surface of the light-blocking wall 50 away from the light-emitting chips 30. In this way, when the light-emitting chips 30 emit light, the light-emitting module 1 has a consistent overall appearance color, and has good appearance consistency. The light-blocking wall 50 may be white dam adhesive dispensed on the carrier circuit board 10, or a white light-blocking sheet that is fixed on the carrier circuit board 10 and can reflect light. The light-blocking wall 50 may play two roles: one is to make an appearance of a side wall of the light-emitting module 1 appear white, and the other is that the light-blocking wall 50 has a high reflectivity, and can reflect light back into a space enclosed by the light-blocking wall 50, thereby being beneficial to improve uniformity of light emitting from an edge of the light-emitting module 1.

In some embodiments of the present disclosure, the light conversion medium layer 70 may be a fluorescent adhesive layer, and may also be a quantum-dot (QD) adhesive layer, and in some embodiments, the light conversion medium layer 70 is the fluorescent adhesive layer. It is known to persons of ordinary skill in the art that current light-emitting chips, such as LEDs, mini LEDs, and micro LEDs, can only emit light of one of three primary colors (namely, red light, blue light, and green light), and therefore the first color light emitted by the light-emitting chip 30 is red light, blue light, or green light, and the light conversion medium layer 70 is configured to convert light of the three primary colors emitted by the light-emitting chip 30 into light of other colors (namely, the second color light), which is generally white light. A specific conversion principle of light color conversion of the light conversion medium layer 70 is the same as that of an existing fluorescent adhesive layer or QD adhesive layer, and will not be described in detail here. In addition, it should be understood that, when the light-emitting module 1 emits no light, the light conversion medium layer 70 made of the fluorescent adhesive layer usually appears yellow, the white light-blocking wall 50 can block the light conversion medium layer 70 filled in the space surrounded by the light-blocking wall 50, only part of the light conversion medium layer 70 covering the light-blocking wall 50 will be exposed, and therefore, the light-emitting module 1 almost appears white as a whole when the light-emitting module 1 emits no light. The light-emitting module which is not emitting light has the same appearance color as the light-emitting module 1 during light-emitting, which helps to improve a sense of beauty of appearance.

It should be noted that, as illustrated in FIG. 1, in some embodiments of the present disclosure, one side of the light conversion medium layer 70 away from the carrier circuit board 10 exceeds a corresponding side of the light-blocking wall 50. The corresponding side of the light-blocking wall 50 is the side of the light-blocking wall 50 away from the carrier circuit board 10. An edge of the light conversion medium layer 70 exceeding the light-blocking wall 50 covers an upper surface of the light-blocking wall 50 (namely, a surface of the side of the light-blocking wall 50 away from the carrier circuit board 10). A cross section of the light-conversion medium layer 70 is substantially T-shaped. It should be understood that the light conversion medium layer 70 covers both the multiple light-emitting chips 30 and the light-blocking wall 50, when the light-emitting chips 30 emit light, due to the light-transmission property of the light conversion medium layer 70, both part of the light conversion medium layer 70 covering the light-blocking wall 50 and part of the light conversion medium layer 70 in the space enclosed by the light-blocking wall 50 emit light and emit light evenly. In this way, when the light-emitting module 1 emits light, the brightness of the whole surface of the light-emitting module 1 is uniform, so that the brightness of part of the light-emitting module 1 corresponding to the light-blocking wall 50 is not less than that of the rest part of the light-emitting module 1, a black border is avoided. In addition, when the light-emitting module 1 is used as a backlight source of a display panel, the display effect of the display panel can also be improved, and good visual experience can be brought to a user.

Figure 2:
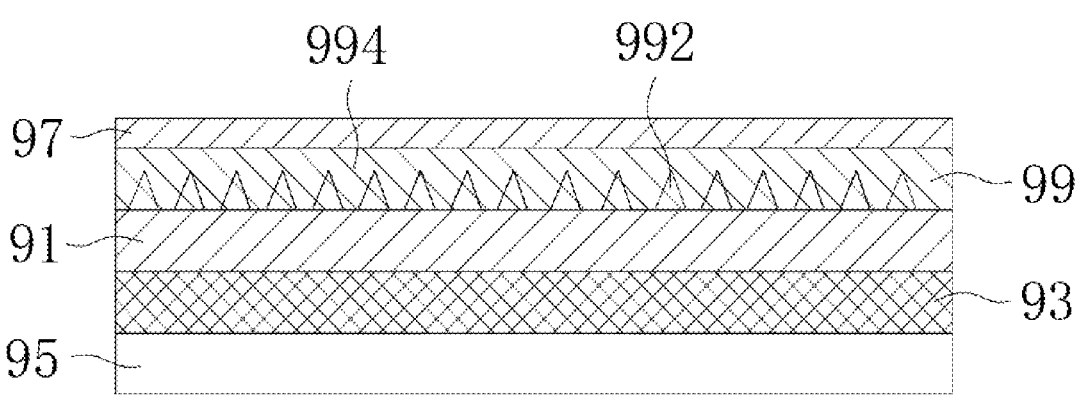
FIG. 2 is a cross-sectional schematic structural view of a decorative film in FIG. 1.

Further, reference is made to FIG. 2, and in some embodiments of the present disclosure, the light-emitting module 1 further includes a decorative film 90 covering the light conversion medium layer 70. The decorative film 90 can protect the light conversion medium layer 70 and prevent the light conversion medium layer 70 from being damaged, thereby ensuring the uniformity of light emitting of the light-emitting module 1. Moreover, the decorative film 90 can also achieve a decorative effect.

Specifically, as illustrated in FIG. 2, the decorative film 90 includes a film body 91 and a decorative layer on the film body 91. The decorative layer includes at least one of a semitransparent colored ink layer 93, a light diffusing ink layer 95, or a texture layer, and the texture layer is transparent or semitransparent.

The material of the film body 91 may be, but is not limited to, one of or any combination of polyethylene terephthalate (PET), glass fiber board, glass, or polymethyl methacrylate (PMMA). The semitransparent colored ink layer 93, the light diffusing ink layer 95, and the texture layer can all transmit the second color light (namely, white light) converted by the light conversion medium layer 70 when the light-emitting chips 30 emit light. The semitransparent colored ink layer 93 is configured to make the decorative film 90 present the same color as the semitransparent colored ink layer 93 when the light-emitting chips 30 emit no light, the texture layer is configured to make the decorative film 90 present at least one appearance effect of a pattern effect, a dazzle effect, a matt effect, or a discoloration effect when the light-emitting chip 30 emit no light, and the light diffusing ink layer 95 is configured to evenly disperse light passing through the light diffusing ink layer 95 when the light-emitting chips 30 emits light, thus the uniformity of the light emitting of the light-emitting module 1 is improved.

Specifically, in an embodiment as illustrated in FIG. 2, the decorative layer includes the semitransparent colored ink layer 93, the light diffusing ink layer 95, the first texture layer 97, and the second texture layer 99.

The semitransparent colored ink layer 93 can allow the second color light (namely, white light) converted by the light conversion medium layer 70 to pass through, and make the light-emitting module 1 present a color when the light-emitting module 1 emits no light, thereby improving a sense of beauty of appearance of the light-emitting module 1. The light diffusing ink layer 95 can have a light diffusing effect, thereby improving uniformity of light emitting of the light-emitting module 1.

The semitransparent colored ink layer 93 and the light diffusing ink layer 95 are both formed on a surface of the film body 91 close to the light conversion medium layer 70, and the semitransparent colored ink layer 93 is between the film body 91 and the light diffusing ink layer 95. Of course, the semitransparent colored ink layer 93 may also be on one side of the light diffusing ink layer 95 away from the film body 91. In some embodiments, one or more light diffusing ink layers 95 may be disposed. Compared with a single-layer light diffusing ink layer, arranging multiple light diffusing ink layers can further improve uniformity of light emitting of the light-emitting module 1.

It should be understood that, the semitransparent colored ink layer 93 may be formed by using an existing translucent color ink and by means of printing, and likewise, any one of the light diffusing ink layers may be formed by using an existing light diffusing ink (generally, a white ink) and by means of printing, which will not be elaborated herein.

As illustrated in FIG. 2, in an embodiment of the present disclosure, the second texture layer 99 includes multiple micro-structures 992 on a surface of the film body 91 away from the light-conversion medium layer 70 and a brightness enhancement film 994 covering the multiple micro-structures 992. Each micro-structure 992 has at least one reflective surface, and an angle between the reflective surface and the film body 91 is greater than 90°. The second texture layer 99 is configured to present the dazzle effect. The first texture layer 97 is on a surface of the brightness enhancement film 994 away from the film body 91. The first texture layer 97 includes at least one stripe texture of a linear texture, a coil texture, or a wave texture. The stripe texture may be arranged according to a preset pattern, so that the first texture layer 97 is configured to present the pattern effect.

In this embodiment, the second texture layer 99 and the first texture layer 97 are formed on the film body 91 of the decorative film 90 in sequence. When the light-emitting module 1 emits no light and there is other light irradiating the decorative film 90, a texture pattern of the first texture layer 97 can be clearly presented, thus the preset pattern corresponding to a texture on the first texture layer 97 can be viewed by users, and a sense of beauty brought to the light-emitting module 1 by the decorative film 90 can be improved. Moreover, light can pass through the first texture layer 97 which is transparent or semitransparent, and further irradiate the second texture layer 99. Since the second texture layer 99 includes multiple micro-structures 992 having reflective surfaces, light incident on the decorative film 90 can be reflected at various angles and thus brightness can be improved in combination with the brightness enhancement film 994. In this way, the dazzle effect can be presented, a visual dead angle of the decorative film 90 can be reduced, and the brightness of the decorative film 90 can be improved. In addition, a certain optical path difference exists between reflected light in the first texture layer 97 and reflected light in the second texture layer 99, so that brightness of reflected light in different texture layers is different, and contrast between different texture layers of the decorative film 90 can be increased, so that appearance effects of different texture layers are superposed, layers are clearer, and a spatial stereo effect is stronger. It should also be understood that, the color of the semitransparent colored ink layer 93 matches with the dazzle effect produced by the second texture layer 99, so that some regions of the decorative film 90 preset a dazzling color, and a region where the decorative film 90 produces the dazzling color and the dazzling color will change according to the different viewing angles of the user.

It should be noted that the brightness enhancement film 994 in the second texture layer 99 may be formed with coating process. The brightness enhancement film 994 covers the multiple microstructures 992, which not only improves brightness of light reflected by the multiple micro-structures 992, but also improves the brightness of the decorative film 90. Moreover, the brightness enhancement film 994 covers the multiple micro-structures 992, and thus the flatness of the second texture layer 99 is improved, which is more beneficial to forming the first texture layer 97 on the flat second texture layer 99. It should also be noted that, the first texture layer 97 and the second texture layer 99 each may be prepared by using any existing texture forming manner, including but not limited to printing, pad printing, computer numerical control (CNC), or the like. Specifically, in some embodiments of the present disclosure, the first texture layer 97 and the second texture layer 99 may be formed by printing an ultraviolet (UV) texture adhesive, and a texture layer with a certain thickness is formed by adjusting a thickness of the printed UV texture adhesive and controlling a printing process, so as to obtain a better texture effect.

In some embodiments, the strip texture on the first texture layer 97 may be one of a linear texture, a spiral texture, a coil texture, or a wave texture, or any combination thereof, which is not limited herein.

As illustrated in FIG. 2, in some embodiments of the present disclosure, each micro-structure 992 in the second texture layer 99 may be, but is not limited to, a pyramid structure or a frustum structure. Specifically, in an embodiment as illustrated in FIG. 2, the multiple micro-structures 992 are multiple quadrangular pyramid structures arranged in an array, and each micro-structure 992 has four reflective surfaces (namely, side surfaces of the quadrangular pyramid). The multiple micro-structures 992 may also be multiple triangular pyramid structures, multiple pentagonal pyramid structures, or other pyramid structures having multiple reflective surfaces arranged in an array, which is not limited herein. In the embodiment as illustrated in FIG. 2, each micro-structure 992 of the second texture layer 99 has multiple reflective surfaces, so that multi-angle light reflection can be achieved, and light reflected by the decorative film 90 can be received by a user in a wide range, thereby improving the brightness and flatness of the decorative film 90. In other embodiments, the multiple micro-structures 992 may also be multiple frustum structures arranged in an array, and each micro-structure 992 includes a ring-shaped reflective surface (namely, a ring-shaped tapered surface of a frustum structure), which may also achieve multi-angle light reflection and improve brightness and flatness of the decorative film 90, which is not described in detail herein.

It can be understood that, in some embodiments of the present disclosure, an angle greater than 90° is defined between the reflective surface of each micro-structure 992 and the film body 91. If the angle is too small, that is, the reflective surface is inclined too much relative to the film body 91, the user can only receive light reflected by the reflective surface from a side-viewing direction, thus reducing surface flatness of the decorative film 90 in appearance. On the contrary, if the angle is too large, that is, the reflective surface is inclined too small relative to the film body 91, the user can only receive the light reflected by the reflective surface from a front-viewing direction or from a direction proximate to the front-viewing direction, but the user often views the decorative film 90 from the side-viewing direction, which reduces the brightness of the decorative film 90. Therefore, the angle between the reflective surface of each micro-structure 992 and the film body 91 should be reasonably designed, and in some embodiments, the angle between the reflective surface of each micro-structure 992 and the film body 91 is in a range of 120 degrees~160 degrees.

Reference is made to FIG. 3, and based on the same inventive concept, a method for manufacturing a light-emitting module is also provided in the present disclosure, and is used for manufacturing the light-emitting module 1 according to any one of the above embodiments. Reference is made to FIGS. 1 to 3 together, the method for manufacturing a light-emitting module at least includes operations at S1 to S3 as follows.

At S1, a carrier circuit board 10 is provided and multiple light-emitting chips 30 are packaged on the carrier circuit board 10. Specifically, the multiple light-emitting chips 30 may be assembled to a die-bonding region of the carrier circuit board 10 by using a die-bonding machine, and then pins of the light-emitting chip 30 are soldered to corresponding pins of the carrier circuit board 10, so that the light-emitting chip 30 is packaged on the carrier circuit board 10, and the multiple light-emitting chips 30 can be driven by the carrier circuit board 10. Whether each of the light-emitting chips 30 can emit light normally is checked.

The carrier circuit board 10 may be a FCB, and may also be a PCB, and in some embodiment, the carrier circuit board 10 is the FCB. The light-emitting module 1 made by using the FCB as a carrier can be bent and folded according to requirements, and can be applicable to various occasions, thereby enhancing the applicability of the light-emitting module 1.

The multiple light-emitting chips 30 each at least include one of an LED, a mini LED and a micro LED, and in some embodiments, the multiple light-emitting chips 30 each is a mini LED. The multiple light-emitting chips 30 use the same kind of light-emitting chips, which can reduce the design difficulty of a drive circuit of the carrier circuit board 10. In addition, the size of the Mini LED is smaller than the size of the LED and the size of the micro LED, which can reduce the thickness of the light-emitting module 1 (namely, the size in a direction perpendicular to the carrier circuit board 10), thereby being beneficial to reduce the thickness of an electronic device using the light-emitting module 1. The light-emitting module 1 may be provided with one or more light-emitting chips 30. Generally, multiple light-emitting chips 30 may be arranged in a matrix, so as to ensure the uniformity of light emitting of the light-emitting module 1.

It is known to persons of ordinary skill in the art that current light-emitting chips, such as LEDs, mini LEDs, and micro LEDs, can only emit light of one of three primary colors (namely, red light, blue light, and green light), and therefore the first color light emitted by the light-emitting chip 30 is red light, blue light, or green light.

At S2, a light-blocking wall 50 is formed on the carrier circuit board 10, the light-blocking wall 50 surrounds the multiple light-emitting chips 30. Specifically, in a possible embodiment, a dam adhesive (usually a white dam adhesive) can be dispensed on the carrier circuit board 10 by a dispenser, and is located at a periphery of the multiple light-emitting chips and the dam adhesive forms the light-blocking wall 50. In another possible embodiment, a ring-shaped white light-blocking sheet that can reflect light may be fixed on the carrier circuit board 10 by means of adhesion, etc., and the light-blocking sheet is located at the periphery of the multiple light-emitting chips 30, and the light-blocking sheet forms the light-blocking wall 50. The light-blocking wall 50 may play two roles: one is to make an appearance of a side wall of the light-emitting module 1 appear white, and the other is that the light-blocking wall 50 has a high reflectivity, and can reflect light back into a space enclosed by the light-blocking wall 50, thereby being beneficial to improve uniformity of light emitting from an edge of the light-emitting module 1.

At S3, a light conversion medium layer 70 is formed, where the light conversion medium layer 70 covers the multiple light-emitting chips 30 and part of the carrier circuit board in a space enclosed by the light-blocking wall 50. The light conversion medium layer 70 is configured to convert first color light emitted by the light-emitting chip 30 into second color light. One side of the light conversion medium layer 70 away from the carrier circuit board 10 exceeds one side of the light-blocking wall 50 away from the carrier circuit board 10. The edge of the light conversion medium layer 70 exceeding the light-blocking wall 50 covers a surface of the light-blocking wall 50 away from the carrier circuit board 10.

Specifically, in some embodiments of the present disclosure, the light conversion medium layer 70 may be a fluorescent adhesive layer or a QD adhesive layer. The light conversion medium layer 70 is configured to convert the first color light (namely, red light, blue light, or green light) emitted by the light-emitting chip 30 into the second color light with other colors, typically white light. A specific conversion principle of light color conversion of the light conversion medium layer 70 is the same as that of an existing fluorescent adhesive layer or QD adhesive layer, and will not be described in detail here.

In the light-emitting module 1 manufactured through the above operations, the light conversion medium layer 70 covers both the multiple light-emitting chips 30 and the light-blocking wall 50. When the light-emitting chips 30 emit light, due to the light-transmission property of the light conversion medium layer 70 such as the fluorescent adhesive and the QD adhesive, part of the light conversion medium layer 70 covering the light-blocking wall 50 and part of the light conversion medium layer 70 in the space surrounded by the light-blocking wall 50 both emit light and emit light evenly. In this way, when the light-emitting module 1 emits light, the brightness of the whole surface of the light-emitting module 1 is uniform, so that the brightness of part of the light-emitting module 1 corresponding to the light-blocking wall 50 is not less than that of the rest part of the light-emitting module 1, and a black border is avoided. When the light-emitting module 1 is used as a backlight source of a display panel, the display effect of the display panel can be improved, and good visual experience can be brought to a user.

In some embodiments, reference is made to FIGS. 1, 2, and 4 together, and in some embodiments of the present disclosure, forming the light conversion medium layer 70 at S3 specifically includes the following.

At S31, a liquid light conversion medium (namely, a liquid fluorescent adhesive or a liquid QD adhesive) is laid on the carrier circuit board 10, so that the liquid light conversion medium covers the multiple light-emitting chips 30 and the light-blocking wall 50.

At S32, the liquid light conversion medium is covered with a decorative film 90, where the decorative film 90 includes a film body 91 and a decorative layer on the film body 91, the decorative layer includes at least one of a semitransparent colored ink layer 93, a texture layer, or a light diffusing ink layer 95, and the texture layer is transparent or semitransparent.

The material of the film body 91 may be, but is not limited to, one or any combination of PET, glass fiber board, glass, and polycarbonate (PC). The semitransparent colored ink layer 93, the texture layer, and the light diffusing ink layer 95 can all transmit the second color light (namely, white light) converted by the light conversion medium layer 70 when the light-emitting chips 30 emit light. The semitransparent colored Ink layer 93 is configured to make the decorative film 90 present the same color as the semitransparent colored ink layer 93 when the light-emitting chips 30 emit no light, the texture layer is configured to make the decorative film 90 present at least one appearance effect of a pattern effect, a dazzle effect, a matt effect, or a discoloration effect when the light-emitting chip 30 emit no light, and the light diffusing ink layer 95 is configured to evenly disperse light passing through the light diffusing ink layer 95 when any one of the light-emitting chips 30 emits light.

For example, in an embodiment as illustrated in FIG. 2, the decorative layer includes the semitransparent colored ink layer 93, the light diffusing ink layer 95, the first texture layer 97, and the second texture layer 99. The second texture layer 99 includes multiple micro-structures 992 on a surface of the film body 91 away from the light conversion medium layer 70 and a brightness enhancement film 994 covering the multiple micro-structures 992. Each micro-structure 992 has at least one reflective surface, and an angle between the reflective surface and the film body 91 is greater than 90°. The second texture layer 99 is configured to present the dazzle effect. The first texture layer 97 is on a surface of the brightness enhancement film 994 away from the film body 91. The first texture layer 97 includes at least one stripe texture of a linear texture, a coil texture, or a wave texture. The stripe texture may be arranged according to a preset pattern, so that the first texture layer 97 is configured to present the pattern effect. The semitransparent colored ink layer 93, the light diffusing ink layer 95, the first texture layer 97, and the second texture layer 99 further respectively have all structures and functions of the semitransparent colored ink layer 93, the light diffusing ink layer 95, the first texture layer 97, and the second texture layer 99 described in the above light-emitting module 1. For more detailed description, reference may be made to the foregoing relevant content, and details are not described herein again.

At S33, a semi-finished assembly formed by the carrier circuit board 10, the multiple light-emitting chips 30, the light-blocking wall 50, the liquid light conversion medium, and the decorative film 90 is placed together into a molding device, and the semi-finished assembly is molded with the molding device until a thickness of the semi-finished assembly is a preset thickness. The molding device may be, but is not limited to, an existing molding machine, and the molding machine may mold the semi-finished assembly in a vacuum state. By molding the semi-finished assembly, the thickness of the semi-finished assembly may reach a preset thickness, for example, 0.48 mm. The light-emitting module 1 manufactured on the basis of the semi-finished assembly can be made to be relatively thin, and when the light-emitting module 1 is applied to any electronic device, the electronic device may also be very thin, which helps to achieve a light and thin design of the electronic device. It can be understood that a reasonable preset thickness can be obtained by reasonably designing a mold in the molding device, which will not be elaborated herein.

At S34, the molded semi-finished assembly is baked, so that the liquid light-conversion medium is cured to form the light conversion medium layer 70, and the decorative film sheet 90 is adhered and covered on a surface of the light conversion medium layer 70 away from the carrier circuit board 10 by molding.

In the above embodiment, the decorative film 90 is adhered to the light conversion medium layer 70 through integral molding, which not only helps to reduce the thickness of the manufactured light-emitting module 1, but also enhances a binding force between the decorative film 90 and the light conversion medium layer 70. In this way, the decorative film 90 is not easy to fall off, which helps the decorative film 90 protect the light conversion medium layer 70, thereby preventing the light conversion medium layer 70 from being damaged, and ensuring the uniformity of light emitting of the light-emitting module 1. Moreover, the decorative film 90 can also play a role of decoration with the aid of the semitransparent colored ink layer 93 and/or the texture layer on the film body 91, thereby improving a sense of beauty of the appearance of the light-emitting module 1 when not emitting light.

Of course, in other embodiments, the light conversion medium layer 70 and the decorative film 90 covering the light conversion medium layer 70 may also be sequentially formed in a step-by-step manner. Specifically, after the light conversion medium layer 70 formed at S3 is in a solid state and the light conversion medium layer 70 is formed, the method for manufacturing a light-emitting module further includes the following.

The decorative film 90 is covered on the light conversion medium layer 70 in the solid state, and the decorative film 90 is adhesively fixed to a surface of the light conversion medium layer 70 away from the carrier circuit board 10. The decorative film 90 is adhesively fixed to a surface of the light conversion medium layer 70 away from the carrier circuit board 10 by means of adhesion, as such the light conversion medium layer 70 can also be protected so as to prevent the light conversion medium layer 70 from being damaged, and uniformity of light emitting of the light-emitting module 1 can be guaranteed. In addition, the decorative film 90 can also play a role of decoration with the aid of the semitransparent colored ink layer 93 and/or the texture layer on the film body 91 of the decorative film 90, and a sense of beauty of the appearance of the light-emitting module 1 when not emitting light is enhanced.

Further, in some embodiments of the present disclosure, the method for manufacturing the light-emitting module 1 further includes the following.

Cut down from a surface of the decorative film 90 away from the carrier circuit board along an edge of the light-blocking wall 50 until the carrier circuit board 10 is cut off, to obtain the light-emitting module 1 with a preset shape, where a cutting surface generated in cutting is located between an outer side and an inner side of the light-blocking wall 50, that is the light-blocking wall 50 is partially cut in thickness. By cutting the light-emitting module 1 manufactured through the described operations along the edge of the light-blocking wall 50, part of the light-blocking wall 50 is cut off, the light-emitting module 1 can be cut into a preset shape according to requirements, so as to reduce an overall size of the light-emitting module 1, and in addition, the light-blocking wall 50 is not completely cut off along a thickness direction, thereby ensuring that the light-blocking wall 50 can still play the above two roles.

In addition, it can be understood by those of ordinary skill in the art that multiple the light-blocking walls 50 can be on the same carrier circuit board 10 at the same time, and multiple light-emitting chip 30 can be in each of the light-blocking walls 50, then a same light conversion medium layer 70 covers the entire carrier circuit board 10, and the decorative film 90 covers the light conversion medium layer 70. By cutting each of the light-blocking walls 50, multiple light-emitting module 1 each having a preset shape can be obtained thereby improving a production efficiency of the light-emitting module 1.

Figure 5:
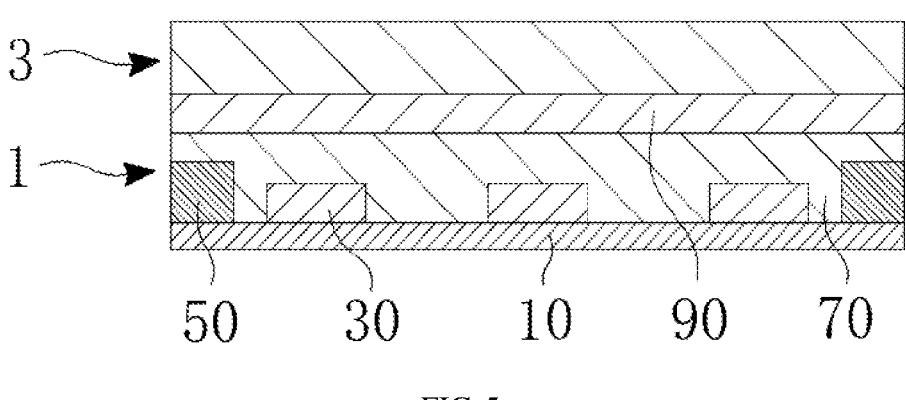
FIG. 5 is a cross-sectional schematic structural view of a display panel provided in an embodiment of the present disclosure.

Please refer to FIG. 5, a display panel 100 is further provided in the present disclosure. The display panel 100 includes a display screen 3 and the light-emitting module 1 in any one of the above embodiments. The light-emitting module 1 is at a non-display side of the display screen 3 to serve as a backlight source of the display screen 3. In the light-emitting module 1, a black border can be avoided, the display effect of the display panel 100 can be improved, and good visual experience can be brought to the user.

It should be understood that, since the light-emitting module 1 of the display panel 100 provided in the present disclosure includes all technical solutions of all the above embodiments, the light-emitting module 1 of the display panel 100 has at least all the beneficial effects brought by the technical solutions of the above embodiments, which will not be elaborated herein.

Figure 6:
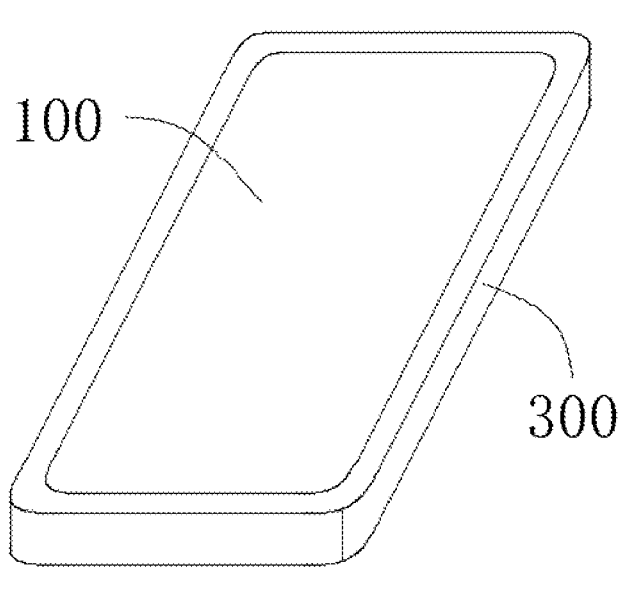
FIG. 6 is a three-dimensional schematic structural view of an electronic device provided in an embodiment of the present disclosure.

Reference is further made to FIG. 6, and an electronic device 1000 is further provided in the present disclosure. The electronic device 1000 may be, but is not limited to, an electronic device such as a mobile phone, a tablet, or a display. As illustrated in FIG. 6, the electronic device 1000 includes a housing 300 and a display panel 100 on the housing 300. The display panel 100 includes a display screen and the light-emitting module 1 in any one of the above embodiments. The light-emitting module 1 is at a non-display side of the display screen to serve as a backlight source of the display screen 3. In the light-emitting module 1, a black border can be avoided, the display effect of the display panel 100 can be improved, and good visual experience can be brought to a user.

Figure 7:
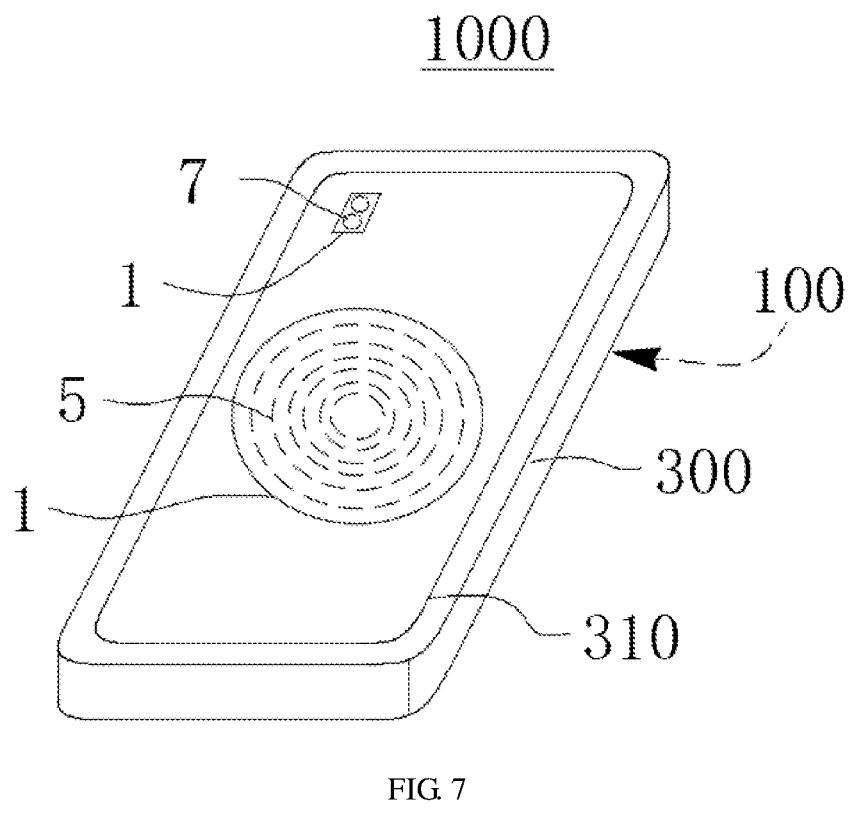

Please refer to FIG. 7, in some embodiments of the present disclosure, the housing 300 has a transparent region 310, the light-emitting module 1 is at an inner side of the housing 300, and the light-emitting module 1 is visible on the housing 300 through the transparent region 310.

It should be noted that, similar to an existing electronic device, the electronic device 1000 further includes other electronic components such as a control module, a camera module, a wireless charging module, a memory, and a sensor. The carrier circuit board 10 of the light-emitting module 1 may be electrically connected to the control module of the electronic device 1000. The control module may control the light-emitting chip 30 on the carrier circuit board 10 to emit light or not to emit light, thus the light-emitting chip 30 is used to indicate a state of charge, new information, or the like of the electronic device 1000, realizing interaction between state of the electronic device 1000 and the light-emitting module 1.

As illustrated in FIG. 7, in some embodiments of the present disclosure, the housing 300 includes a rear cover opposite to the display screen of the electronic device 1000 and a middle frame for fixing the display screen and the rear cover. In some embodiments, the rear cover and the middle frame each may be entirely or partially made of a transparent material (not limited to glass, transparent plastic, or the like), and transparent part of the rear cover and transparent part the middle frame form the transparent region 310. In an embodiment as illustrated in FIG. 7, the entire rear cover of the housing 300 is made of the transparent material, that is, the entire rear cover forms the transparent region 310. The entire rear cover is made into the transparent region 310, which not only facilitates processing and preparation, but also enables multiple electronic components, such as the camera module 7 and the wireless charging module 5, in the electronic device 1000 to be visible on the housing 300 through the transparent rear cover (namely, the transparent region 310). Therefore, various electronic components and the arrangement thereof can be seen by the user from back of the electronic device 1000, which helps to improve sense of science and technology and the overall a sense of beauty of the electronic device 1000.

In some embodiments of the present disclosure, the light-emitting module 1 is around part of the electronic components visible on the housing 300. For example, in an embodiment as illustrated in FIG. 7, the camera module 7 and the wireless charging module 5 of the electronic device 1000 are both visible on the housing 300 through the transparent region 310, and a light-emitting module 1 is around the camera module 7 and a light-emitting module 1 is around the wireless charging module 5. In this way, when the camera module 7 is used for photographing, the control module of the electronic device 1000 may control the light-emitting module 1 around the camera module 7 to perform light supplementation, thereby improving a photographing effect and avoiding deficiencies such as excessive exposure caused by a flash lamp of the electronic device 1000. Likewise, when the wireless charging module 5 is used for charging, the control module of the electronic device 1000 may control the light-emitting module 1 around the wireless charging module 5 to prompt the user of a current charging progress of the electronic device 1000.

In other embodiments, the electronic device 1000 may also be provided with multiple light-emitting modules 1 at different positions at the inner side of the housing 300, so that the multiple light-emitting modules 1 together, form a preset pattern, which will not be elaborated herein.

It can be understood that, in the electronic device 1000, the light-emitting module 1 included in the electronic device 1000 may be the light-emitting module 1 described in any one of the foregoing embodiments, and therefore, the light-emitting module 1 has at least all beneficial effects brought by the technical solutions of the foregoing embodiments. For a more specific description, reference may be made to related content of the light-emitting module 1 described in the foregoing embodiments, which will not be described in detail again.

In the description of the present disclosure, terms "an embodiment", "specific embodiment", "example, or the like" means that a particular feature, structure, material, or characteristic described in conjunction with the embodiment or example is included in at least one embodiment or example of the present disclosure. Therefore, in the description, illustrative descriptions of the above terms do not necessarily refer to the same embodiments or examples. Furthermore, the particular feature, structure, material, or characteristic may be combined in any suitable manner in one or more embodiments or examples.

Although embodiments of the present disclosure have been illustrated and described, it would be appreciated by those of ordinary skill in the art that the above embodiments cannot be construed to limit the present disclosure, and changes, alternatives, and modifications can be made in the embodiments without departing from spirit, principles and scope of the present disclosure.

What is claimed is:

1. A light-emitting backlight source, comprising:
a carrier circuit board;
a plurality of light-emitting chips packaged on the carrier circuit board, wherein each light-emitting chip is configured to emit first color light;
a light-blocking wall on the carrier circuit board and surrounding the plurality of light-emitting chips; and
a light conversion medium layer covering the plurality of light-emitting chips and part of the carrier circuit board in a space enclosed by the light-blocking wall, wherein the light conversion medium layer is configured to convert the first color light emitted by the light-emitting chips into second color light, one side of the light conversion medium layer away from the carrier circuit board exceeds one side of the light-blocking wall away from the carrier circuit board, and an edge of the light conversion medium layer exceeding the light-blocking wall covers a surface of the light-blocking wall away from the carrier circuit board,
wherein the light-blocking wall has a same color as the second color light at least on an outer surface of the light-blocking wall away from the light-emitting chips.

2. The light-emitting backlight source of claim 1, further comprising a decorative film covering the light conversion medium layer, wherein the decorative film comprises a film body and a decorative layer on the film body, the decorative layer comprises at least one of a semitransparent colored ink layer, a texture layer, or a light diffusing ink layer, and the texture layer is transparent or semitransparent; and wherein the semitransparent colored ink layer is configured to make the decorative film present a same color as the semitransparent colored ink layer when the light-emitting chips emit no light, the texture layer is configured to make the decorative film present at least one appearance effect of a pattern effect, a dazzle effect, a matt effect, or a discoloration effect when the light-emitting chips emit no light, and the light diffusing ink layer is configured to evenly disperse light passing through the light diffusing ink layer when the light-emitting chips emit light,
wherein the decorative layer comprises a first texture layer and a second texture layer, the second texture layer comprises a plurality of micro-structures on a surface of the film body away from the light conversion medium layer and a brightness enhancement film covering the plurality of micro-structures, each of the microstructures has at least one reflective surface, and an angle between a reflective surface and the film body is greater than 90°, and the second texture layer is configured to present the dazzle effect; and wherein
the first texture layer is on a surface of the brightness enhancement film away from the film body, the first texture layer has at least one stripe texture of a linear texture, a coil texture, or a wave texture, and the first texture layer is configured to present the pattern effect.

3. The light-emitting backlight source of claim 2, wherein the decorative layer further comprises the semitransparent colored ink layer on a surface of the film body close to the light conversion medium layer and the light diffusing ink layer on a surface of the semitransparent colored ink layer close to the light conversion medium layer.

4. The light-emitting backlight source according to claim 1, wherein the carrier circuit board is a flexible circuit board (FCB) or a printed circuit board (PCB), or the plurality of light-emitting chips comprise at least one of a light-emitting diode (LED), a mini LED, and a micro LED, or the light-blocking wall is a dam adhesive on the carrier circuit board, or the light conversion medium layer is a fluorescent adhesive layer or a quantum-dot (QD) adhesive layer.

5. The light-emitting backlight source according to claim 2, wherein the carrier circuit board is a flexible circuit board (FCB) or a printed circuit board (PCB), or the plurality of light-emitting chips comprise at least one of a light-emitting diode (LED), a mini LED, and a micro LED, or the light-blocking wall is a dam adhesive on the carrier circuit board, or the light conversion medium layer is a fluorescent adhesive layer or a quantum-dot (QD) adhesive layer.

6. The light-emitting backlight source according to claim 3, wherein the carrier circuit board is a flexible circuit board (FCB) or a printed circuit board (PCB), or the plurality of light-emitting chips comprise at least one of a light-emitting diode (LED), a mini LED, and a micro LED, or the light-blocking wall is a dam adhesive on the carrier circuit board, or the light conversion medium layer is a fluorescent adhesive layer or a quantum-dot (QD) adhesive layer.

7. A method for manufacturing a light-emitting backlight source, comprising:
providing a carrier circuit board,
packaging a plurality of light-emitting chips on the carrier circuit board;
forming a light-blocking wall on the carrier circuit board, wherein the light-blocking wall surrounds the plurality of light-emitting chips; and
forming a light conversion medium layer, wherein the light conversion medium layer covers the plurality of light-emitting chips and part of the carrier circuit board in a space enclosed by the light-blocking wall, the light conversion medium layer is configured to convert first color light emitted by the light-emitting chips into second color light, one side of the light conversion medium layer away from the carrier circuit board exceeds one side of the light-blocking wall away from the carrier circuit board, and an edge of the light conversion medium layer exceeding the light-blocking wall covers a surface of the light-blocking wall away from the carrier circuit board, wherein the light-blocking wall has a same color as the second color light at least on an outer surface of the light-blocking wall away from the light-emitting chips.

8. The method for manufacturing the light-emitting backlight source of claim 7, wherein forming the light conversion medium layer comprises:

laying a liquid light conversion medium on the carrier circuit board to make the liquid light conversion medium cover the plurality of light-emitting chips and the light-blocking wall;

covering the liquid light conversion medium with a decorative film;

placing a semi-finished assembly formed by the carrier circuit board, the plurality of light-emitting chips, the light-blocking wall, the liquid light conversion medium, and the decorative film into a molding device, and molding the semi-finished assembly with the molding device until the semi-finished assembly has a preset thickness; and baking the molded semi-finished assembly, to form the light conversion medium layer after the liquid light conversion medium is cured, and to adhere and cover the decorative film on a surface of the light conversion medium layer away from the carrier circuit board by molding.

9. The method for manufacturing the light-emitting backlight source of claim 7, further comprising after the formed light conversion medium layer is in a solid state and the light conversion medium layer is formed:

covering a decorative film on the light conversion medium layer in the solid state, wherein the decorative film is adhesively fixed to a surface of the light conversion medium layer away from the carrier circuit board.

10. The method for manufacturing the light-emitting backlight source of claim 8, wherein the decorative film comprises a film body and a decorative layer on the film body, the decorative layer comprises at least one of a semitransparent colored ink layer, a texture layer, or a light diffusing ink layer, and the texture layer is transparent or semitransparent; and wherein the semitransparent colored ink layer is configured to make the decorative film present a same color as the semitransparent colored ink layer when the light-emitting chips emit no light, the texture layer is configured to make the decorative film present at least one appearance effect of a pattern effect, a dazzle effect, a matt effect, or a discoloration effect when the light-emitting chips emit no light, and the light diffusing ink layer is configured to evenly disperse light passing through the light diffusing ink layer when the light-emitting chips emit light.

11. The method for manufacturing the light-emitting backlight source of claim 9, wherein the decorative film comprises a film body and a decorative layer on the film body, the decorative layer comprises at least one of a semitransparent colored ink layer, a texture layer, or a light diffusing ink layer, and the texture layer is transparent or semitransparent; and wherein the semitransparent colored ink layer is configured to make the decorative film present a same color as the semitransparent colored ink layer when the light-emitting chips emit no light, the texture layer is configured to make the decorative film present at least one appearance effect of a pattern effect, a dazzle effect, a matt effect, or a discoloration effect when the light-emitting chips emit no light, and the light diffusing ink layer is configured to evenly disperse light passing through the light diffusing ink layer when the light-emitting chips emit light.

12. The method for manufacturing the light-emitting backlight source of claim 8, further comprising:

cutting down from a surface of the decorative film away from the carrier circuit board along an edge of the light-blocking wall until the carrier circuit board is cut off, to obtain a light-emitting backlight source with a preset shape, wherein a cutting surface generated in cutting is located between an outer side of the light-blocking wall and an inner side of the light-blocking wall.

13. The method for manufacturing the light-emitting backlight source of claim 9, further comprising:

cutting down from a surface of the decorative film away from the carrier circuit board along an edge of the light-blocking wall until the carrier circuit board is cut off, to obtain a light-emitting backlight source with a preset shape, wherein a cutting surface generated in cutting is located between an outer side of the light-blocking wall and an inner side of the light-blocking wall.

14. A display panel, comprising a display screen and the light-emitting backlight source of claim 1, wherein the light-emitting backlight source is at a non-display side of the display screen.

15. An electronic device, comprising a housing and a display panel on the housing, wherein the display panel comprises a display screen and the light-emitting backlight source of claim 1, and the light-emitting backlight source is at a non-display side of the display screen.

16. The electronic device of claim 15, wherein the housing has a transparent region, the light-emitting backlight source is at an inner side of the housing, and the light-emitting backlight source is visible on the housing through the transparent region.

* * * * *